United States Patent [19]

Shiozawa

[11] Patent Number: 5,475,491
[45] Date of Patent: Dec. 12, 1995

[54] EXPOSURE APPARATUS

[75] Inventor: Takahisa Shiozawa, Yokohama, Japan

[73] Assignee: Canon Kabushiki Kaisha, Tokyo, Japan

[21] Appl. No.: 207,254

[22] Filed: Mar. 8, 1994

Related U.S. Application Data

[63] Continuation of Ser. No. 478,422, Feb. 12, 1990, abandoned.

[30] Foreign Application Priority Data

Feb. 10, 1989 [JP] Japan ................................. 1-31403
Jun. 28, 1989 [JP] Japan ................................. 1-167903

[51] Int. Cl.⁶ ........................... G01B 11/00; G03B 27/74
[52] U.S. Cl. ................................. 356/394; 355/68
[58] Field of Search ............................. 356/394, 218, 356/226; 355/69, 68, 53; 354/410; 250/225, 201, 205

[56] References Cited

U.S. PATENT DOCUMENTS 4,711,568 12/1987 Torigoe et al. ..................... 355/68
4,779,943 10/1988 Tatsuno et al. .

*Primary Examiner*—Richard A. Rosenberger
*Assistant Examiner*—K. P. Hantis
*Attorney, Agent, or Firm*—Fitzpatrick, Cella, Harper & Scinto

[57] ABSTRACT

An exposure apparatus includes a supplying portion for supplying a radiation beam; a detector; an optical arrangement operable to amplitude-divide the radiation beam from the supplying portion to produce first and second beams, the optical arrangement being effective to direct the first beam to a workpiece to expose the same with the first beam and also to direct the second beam to the detector to cause the same to produce a signal; wherein the optical arrangement is arranged so that, independently of a change in the state of polarization of the radiation beam, the signal from the detector is substantially proportional to the intensity of the first beam.

57 Claims, 10 Drawing Sheets

EXPOSURE APPARATUS

This application is a continuation of prior application, Ser. No. 07/478,422 filed Feb. 12, 1990, now abandoned.

FIELD OF THE INVENTION AND RELATED ART

This invention relates to an exposure apparatus and, more particularly, to an exposure apparatus which uses as an exposure light source a laser such as an excimer laser, for example.

In consideration of the recent further increase in the degree of integration of integrated circuits such as LSIs, currently such an exposure apparatus by which a fine pattern of a linewidth not greater than 1 micron can be formed on a wafer accurately is used.

Also, for further reduction in the resolvable linewidth of the apparatus, many attempts have been made to develop an exposure apparatus having as an exposure light source an excimer laser capable of emitting high-intensity light in the deep ultraviolet region.

In such an exposure apparatus, it is necessary that a wafer is exposed with a correct exposure amount having been predetermined. The control of the exposure amount is one important technique. Usually, for such exposure amount control, a half mirror is provided in the path of exposure light and the light reflected by the half mirror or the light transmitted through the half mirror is received by a photoreceptor, provided to monitor the amount of exposure. In accordance with an output signal from this photoreceptor, the opening or closing of a shutter disposed in the path of the exposure light is controlled.

It has been found by the Applicant however that, in conventional exposure apparatuses, the reflection factor (transmission factor) of a half mirror used is not the same for each of a P-polarized component and an S-polarized component of the exposure light and, as a result, the ratio of illuminance upon the photoreceptor and the illuminance upon the wafer is not always constant. This results from the fact that the state of polarization of the exposure light impinging on the half mirror is not always constant, and varies due to any change in the polarization characteristics of a beam emitted by a light source or the structure of an optical system from the light source to the half mirror. Such a problem is particularly notable in an exposure apparatus which uses a laser such as an excimer laser, for example, as an exposure light source.

Accordingly, in conventional exposure apparatuses, particularly, those that use a laser as a light source, there is a difficulty in executing correct exposure amount control constantly.

SUMMARY OF THE INVENTION

It is accordingly an object of the present invention to provide an exposure apparatus with a function of monitoring the amount of exposure, by which correct exposure amount control can be made constantly.

In accordance with a first aspect of the present invention, to achieve the above object, there is provided an exposure apparatus, comprising: supplying means for supplying a radiation beam; a detector; an optical arrangement operable to amplitude-divide the radiation beam from said supplying means to produce first and second beams, said optical arrangement being effective to direct the first beam to a workpiece to expose the same with the first beam and also to direct the second beam to said detector to cause the same to produce a signal; wherein said optical arrangement is arranged so that, independently of a change in the state of polarization of the radiation beam, the signal from said detector is substantially proportional to the intensity of the first beam.

In accordance with a second aspect of the present invention, to achieve the above object, there is provided an exposure apparatus, comprising: supplying means for supplying a radiation beam; a detector; an optical arrangement operable to amplitude-divide the radiation beam from said supplying means to produce first and second beams, said optical arrangement being effective to direct the first beam to a workpiece to expose the same with the first beam and also to direct the second beam to said detector to cause the same to produce a signal; and responsive means being responsive to the signal from said detector, said responsive means being effective to produce a signal substantially proportional to the intensity of the first beam, substantially without being affected by a change in the state of polarization of the radiation beam.

In accordance with a third aspect of the present invention, there is provided an exposure apparatus, comprising: supplying means for supplying a radiation beam; a detector; and an optical arrangement including a beam splitter and optical means; wherein said beam splitter is operable to amplitude-divide the radiation beam from said supplying means to produce first and second beams, said beam splitter further being operable to direct the first beam to a workpiece to be exposed and to direct the second beam to said detector; and wherein said optical means is provided between said beam splitter and said detector, for receiving the second beam from said beam splitter and for directing the received second beam to said detector, wherein said optical means is effective to maintain the ratio of intensity between a P-polarized component and an S-polarized component of the second beam, inputted to said detector, to be substantially the same as the ratio of intensity between a P-polarized component and an S-polarized component of the first beam, independently of a change in the state of polarization of the radiation beam.

In accordance with a fourth aspect of the present invention, there is provided an exposure apparatus, comprising: supplying means for supplying a radiation beam; a first detector; a second detector; and an optical arrangement including first and second beam splitters and responsive means; wherein said first beam splitter is operable to amplitude-divide the radiation beam from said supplying means to produce first and second beams, said first beam splitter being effective to direct the first beam to a workpiece to be exposed; wherein said second beam splitter is operable to amplitude-divide the second beam from said first beam splitter to produce third and fourth beams, said second beam splitter being effective to direct the third beam to said first detector so that a first signal is produced from said first detector, and also to direct the fourth beam to said second detector so that a second signal is produced from said second detector; and wherein said responsive means is responsive to the first and second signals from said first and second detectors, said responsive means being effective to produce a signal substantially proportional to the intensity of the first beam.

In accordance with a fifth aspect of the present invention, there is provided an exposure apparatus, comprising: supplying means for supplying a radiation beam; a first detector; a second detector; and an optical arrangement including a first beam splitter, a second beam splitter and responsive means; wherein said first beam splitter is operable to amplitude-divide the radiation beam from said supplying means to produce first and second beams, said first beam splitter being effective to direct the first beam to said first detector so that a first signal is outputted from said first detector; wherein said second beam splitter is operable to amplitude-divide the second beam from said first beam splitter to produce third and fourth beams, said second beam splitter being effective to direct the third beam to said second detector so that a second signal is outputted from said second detector and also to direct the fourth beam to a workpiece to be exposed; and wherein said responsive means being responsive to the first and second signals from said first and second detectors, said responsive means being effective to produce a signal substantially proportional to the intensity of the fourth beam.

In an exposure apparatus according to the third aspect of the present invention, the optical means may comprise, for example, a beam splitter and one of a transparent parallel plate, a polarizing plate and a transparent flat plate having a dielectric film formed thereon, which is set in a predetermined relationship with the optical axis of the optical arrangement (the direction of advancement of the second beam). In one preferred form, there is provided an adjusting mechanism for adjusting the angle of inclination of the optical means with respect to the optical axis, the angle of rotation of the optical means about a rotational axis taken on the optical axis, or otherwise. With the adjustment by this adjusting mechanism, the action of the optical means upon the second beam can be changed to thereby adjust the ratio in intensity of the P-polarized component and the S-polarized component of the second beam impinging on the detector.

In an exposure apparatus according to the fourth or fifth aspect of the present invention, preferably the second beam splitter has a polarization characteristic which can be represented by Tp/Ts≠ Rp/Rs, wherein Tp and Ts are the transmission factors with respect to the P-polarized component and the S-polarized component, respectively, and wherein Rp and Rs are the reflection factors with respect to the P-polarized component and the S-polarized component, respectively. These polarized components are determined with reference to the first beam splitter.

In an exposure apparatus according to the present invention, the signal from the detector in the first or third aspect, or the signal produced by the responsive means which is responsive to the signal from the detector, in the second, fourth or fifth aspect may be used for the control of the exposure amount.

In an exposure apparatus according to any one of the above-described aspects of the present invention, the supplying means includes a laser as a radiation source for producing a radiation beam. Preferably, such a laser that can produce a high-intensity laser beam in the deep ultraviolet region may be used. By way of example, as will be described with reference to some embodiments of the present invention, an excimer laser which produces laser pulses of a wavelength of 200–300 nm, may be used. Alternatively, a laser unit comprising a combination of a metal vapor laser with a harmonics generator, may be used.

Also, in an exposure apparatus according to any one of the above-described aspects of the present invention, the supplying means includes a laser as a radiation source for producing a radiation beam, and an image rotator is provided in the path of the laser beam from this laser. The image rotator is rotatable about a rotational axis which may be taken along the optical axis of the supplying means. To this image rotator, the laser beam is inputted in a direction substantially parallel to the optical axis. Then, the light emanates from the image rotator in a direction substantially parallel to the optical axis. With the rotation of the image rotator, the emanating laser beam rotates. By this, the sectional intensity distribution of the laser beam which is asymmetrical can be transformed into a symmetrical distribution.

The present invention is applicable to various types of exposure apparatuses such as, for example, a contact type exposure apparatus wherein a mask and a wafer contact to each other, a proximity type exposure apparatus wherein a wafer is disposed in proximity to a mask, a projection type exposure apparatus wherein a projection optical system is disposed between a mask and a wafer, a scanning type exposure apparatus wherein a wafer is scanned with a radiation beam.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
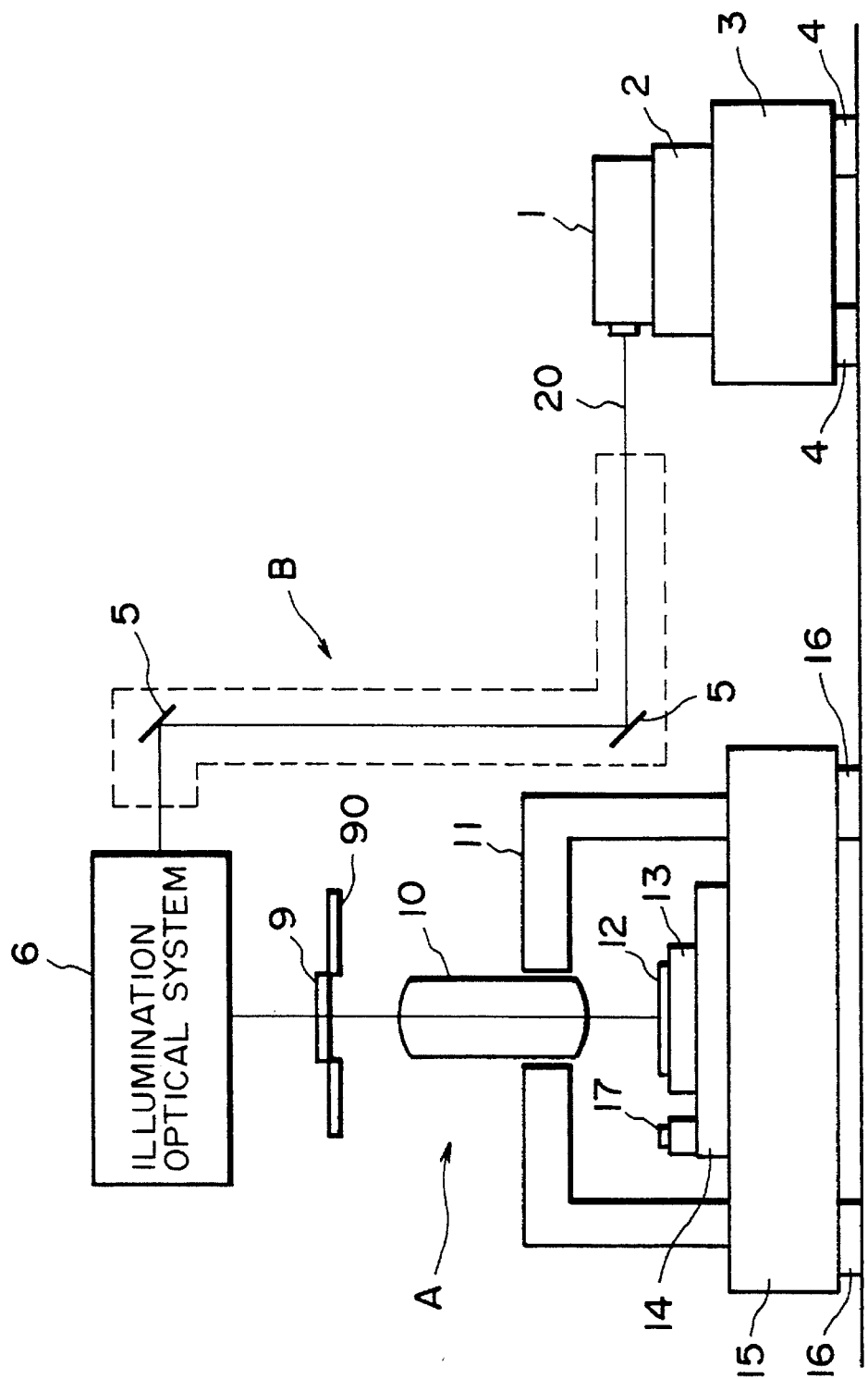
FIG. 1 is a schematic view showing a general structure of an exposure apparatus according to one embodiment of the present invention.

Referring to FIG. 1 which is a schematic view showing the general structure of an exposure apparatus according to one embodiment of the present invention, reference character A denotes a major assembly of the exposure apparatus having an exposure optical system. Denoted at 1 is a KrF excimer laser that emits a predetermined linearly polarized laser light, and it is fixed onto a movable X-Y-θ stage 2 which is placed on a laser surface plate (base) 3 which is mounted on vibration-preventive cushions 4. Denoted at B is a transmission (propagation) system for transmitting pulsed laser light 20 from the laser 1, having a wavelength 248.4 nm and being band-narrowed to an order of a bandwidth 0.005 nm, to an optical system of the exposure apparatus major assembly 1. The transmission system consists of optical components including mirrors 5 as illustrated. Denoted at 6 is an illumination optical system; at 9 is a reticle on which a circuit pattern for the manufacture of semiconductor devices is formed; at 90 is a reticle holder; at 10 is a reduction lens system for projecting in a reduced scale the circuit pattern of the reticle 9; at 11 is a lens support; at 12 is a wafer which is coated with a resist; at 13 is a chuck for holding the wafer 12 by attraction; at 14 is an X-Y stage; at 15 is a stepper surface plate; and at 16 is a vibration-preventive cushion means. The laser light 20 emitted from the excimer laser 1 goes through the transmission system B and enters the illumination optical system 6 of the exposure apparatus major assembly A. Then, after its beam diameter is expanded by the illumination optical system 6, it goes through the reticle 9 and the projection lens system 10 and impinges on the wafer 12. The exposure optical system comprising the illumination optical system 6 and the projection lens system 10 are held and fixed as a unit by means of the lens support 11, which is fixed to the stepper surface plate 15. Therefore, the relative position of the respective optical systems of the exposure apparatus major assembly A is substantially unchangeable. As described, the reticle 9 has the circuit pattern formed thereon and, by the illumination of the circuit pattern with the laser beam through the illumination optical system 6, the circuit pattern is projected through the projection lens system 10 onto the wafer 12 in a reduced scale of 1:5.

The wafer 2 is attracted by vacuum to the wafer chuck 13, and the wafer chuck 13 is fixed to the movable X-Y stage 14 which is provided on the stepper surface plate 15. The wafer 12 can be displaced by means of the X-Y stage 14 in two orthogonal X and Y directions, whereby a reduced pattern can be transferred to a desired site on the wafer.

Usually, reduced patterns of several tens of shots are transferred onto a wafer 12. To this end, the X-Y stage 14 is moved in the X or Y direction while, on the other hand, the laser light is projected to each shot area to transfer a circuit pattern thereto, and this operation is repeated. For each pattern transfer, a number of laser pulses are used.

Denoted at 17 is an illuminomitor comprising a photodetector fixed to the X-Y stage 14. By moving the X-Y stage 14, it can be positioned at the image surface of the projection lens system 10 so that it can measure the illuminance of the laser light on the image surface of the projection lens system 10. The illuminance as measured by this illuminomitor 17 can be considered as the illuminance of the laser light upon the wafer 12 surface and can be used as control data for the control of the amount of exposure during the exposure operation.

Figure 2:
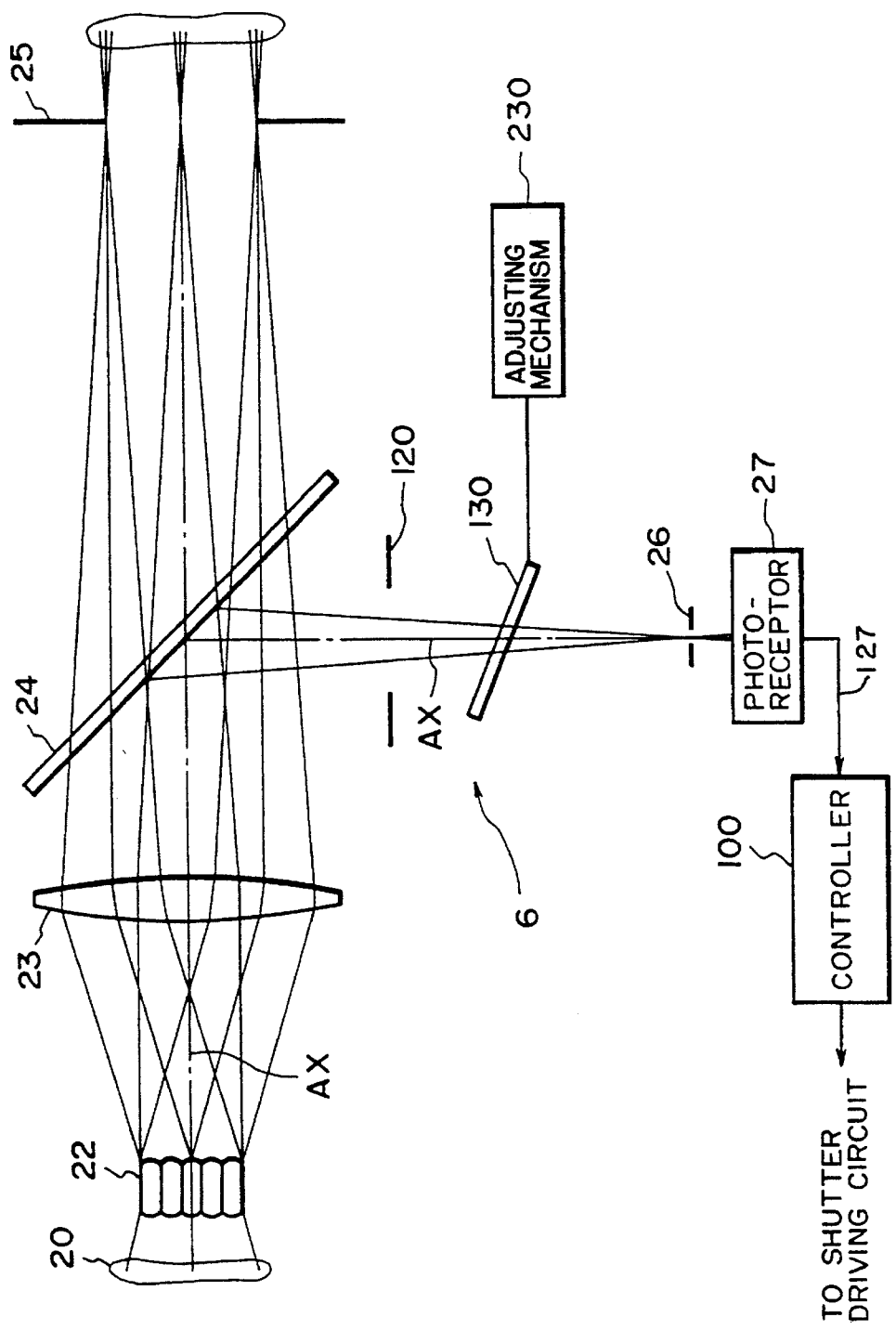
FIG. 2 is a fragmentary enlarged view of an illumination optical system of the FIG. 1 embodiment.

FIG. 2 is a fragmentary enlarged view of the illumination optical system 6 shown in FIG. 1. Denoted in FIG. 2 at 22 is a well-known optical integrator; at 23 is a condenser lens; at 24 is a half mirror (beam splitter); at 25 is a masking blade (field stop); at 26 and 120 each is a stop; at 27 is a photoreceptor; and at 130 is a correcting optical element which comprises a transparent parallel plate, in this embodiment. The half mirror 24 is provided by a transparent flat plate on which a multilayered film made of a dielectric material is formed. The half mirror 24 is disposed with inclination at an angle of 45 degrees with respect to the optical axis AX. The plate substrate of the mirror 24 is provided by a glass plate of $SiO_2$.

The laser light (exposure light) from the transmission system B of FIG. 1, after it goes through an incoherent-transformation optical system (not shown), enters the optical integrator 22. Such an incoherent optical system is adapted to separate a received laser light into a number of mutually incoherent light fluxes, each light flux corresponding in a one-to-one relationship with an associated one of bar-like lenses constituting the optical integrator 22. Accordingly, each of the mutually incoherent light fluxes enters into a corresponding bar-like lens, whereby on the light emission surface of the optical integrator 22 there are formed a number of mutually incoherent secondary light sources, of a number corresponding to that of the bar-like lenses. Thus, the light emission surface provides a secondary light source surface. Each of the lights emanating from the secondary light sources of the optical integrator 22 is concentrated under the influence of the condenser lens 23 and, after passing the half mirror 24, it illuminates an aperture of the masking blade 25. The light inputted to the half mirror 24 is amplitude-divided by the half mirror 24, and a large portion thereof is transmitted through the half mirror and is directed to the masking blade 25. On the other hand, a portion of the light is reflected by the half mirror 24 and, after passing through the stop 120, the correcting optical element 130 and the stop 26, it impinges on the photoreceptor 27. The photoreceptor 27 is operable to photoelectrically convert a received light and to produce a signal corresponding to the intensity of the received light. The masking blade 25 comprises, in this embodiment, a masking mechanism which includes four movable light blocking plates adapted to form an aperture at a position which is optically conjugate with the circuit pattern surface of the reticle 9 with respect to an imaging lens system, not shown. The ratio of the illuminance upon the plane in which this opening is defined and the illuminance upon the circuit pattern surface of the reticle 9 or the wafer 12 surface, can be considered as being substantially constant. It is to be noted here that the position of this aperture and the position of the stop 26 are optically conjugate (equivalent) to each other and, therefore, the photoreceptor 27 can measure the quantity of the laser beam (exposure light) at a position substantially equivalent to the wafer 12 surface. Further, a signal line 127 is provided to apply an output signal from the photoreceptor 27 to a controller 100. During the exposure operation, for each laser pulse, an integrated value of signals inputted to the controller 100 is compared at desired timing with a predetermined reference value. When the former comes equal to the latter, an instruction signal of "shutter closure" is supplied from the controller 100 to a shutter driving circuit (not shown), whereby the shutter operates to intercept the path of the laser light and the exposure operation is stopped.

In the present embodiment, the correcting optical element 130 is disposed with inclination with respect to the optical axis AX. Under the influence of this optical element 130, even if the state of polarization of the laser light inputted to the half mirror 24 changes, the ratio of the P-polarized component and the S-polarized component (with respect to the half mirror 24) passed through the half mirror 24 and the ratio of the P-polarized component and the S-polarized component (with respect to the half mirror 24) of the laser light reflected by the half mirror 24 and impinging on the photoreceptor 27, can always be maintained substantially equal to each other. With this arrangement, independently of the state of polarization of the laser light inputted to the half mirror 24, the ratio in intensity of the transmitted light passed through the half mirror 24 and the light reflected by the half mirror 24 and impinging on the photoreceptor 27, always becomes substantially constant. Therefore, it is possible to assure that the photoreceptor 27 produces a signal which is proportional to the intensity of the transmitted light.

Details of the function of the correcting optical element 130 will be explained, with reference to the principle view of FIG. 3.

Figure 3:
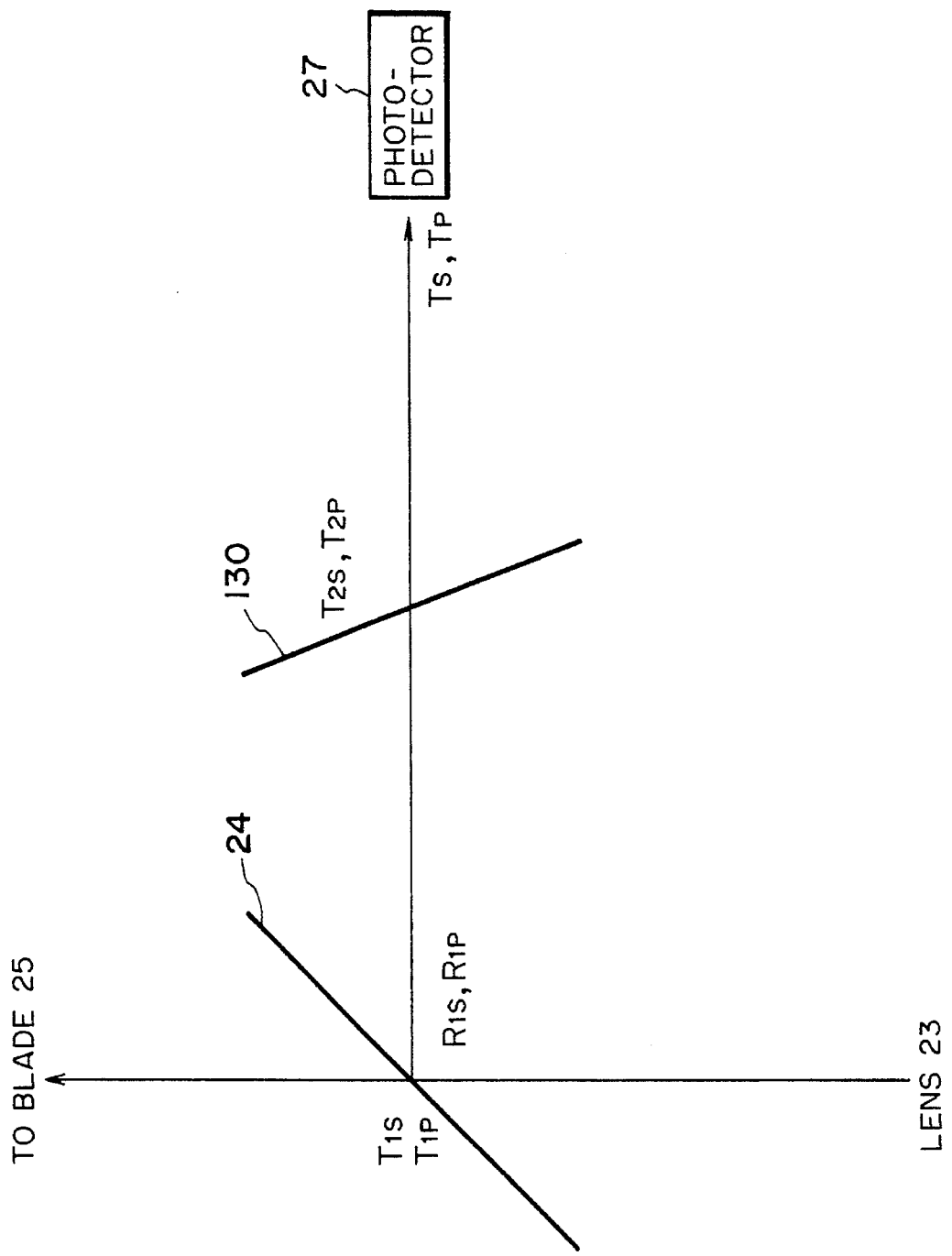
FIG. 3 is a principle view, illustrating the principle of correction by a correcting optical element used in the FIG. 2 arrangement.

FIG. 3 schematically shows the half mirror 24, the correcting optical element 130 and the photodetector 27. Also, reference characters T1s and T1p denote the transmission factors of the half mirror 24 with respect to the S-polarized component and the P-polarized component, respectively. Reference characters R1s and R1p denote the reflection factors of the half mirror 24 with respect to the S-polarized component and the P-polarized component. Reference characters T2s and T2p denote the transmission factors of the optical element 130 to the half mirror 24, with respect to the S-polarized component and the P-polarized component, respectively. Reference characters Ts and Tp denote the transmission factors of the S-polarized component and the P-polarized component of the laser light, with respect to the half mirror 24, inputted to the photoreceptor 27 through the half mirror 24 and the optical element 130. The transmission factors Ts and Tp can be represented by Ts=R1s×T2s and Tp=R1p×T2p. Here, in the present embodiment, the optical element 130 is so disposed to satisfy the relationship:

$$Ts/Tp = T1s/T1p$$

namely, $$T2p/T2s = (T1p \times R1s)/(T1s \times R1p) \quad (1)$$

As a result of this, an illuminance corresponding to and having a substantially constant ratio to the illuminance upon a surface to be illuminated, such as the reticle 9 surface or the wafer 12 surface, is assured upon the light receiving surface of the photoreceptor 27, independently of the state of polarization of the laser light inputted to the half mirror 24.

In the present embodiment, the polarization characteristics T1p, R1s, T1s and R1p of the half mirror 24 with respect to the laser light (λ=248.4 nm) to be inputted thereto are detected beforehand and, in accordance with these characteristics, the optical element 130 is set. If, on the other hand, the polarization characteristics of the half mirror 24 are not predetected, as an example a polarizing element such as a polarizing plate or a half waveplate may be inserted at the laser 1 side of the half mirror 24 to change the state of polarization of the inputted laser light and the disposition of the optical element 130 may be adjusted while monitoring the output signals of the photoreceptor 27 and the illuminomitor 17 (see FIG. 1) so that the ratio of the illuminance upon the wafer 12 surface and the illuminance upon the light receiving surface of the photoreceptor 27 becomes substantially constant, irrespective of the state of polarization of the inputted laser light.

As regards the polarization characteristics of the correcting optical element 130, the ratio of the polarized light component having a higher transmission factor to the polarized light component which is in the direction orthogonal to the former, must be higher than the ratio of (T1p×R1s) to (T1s×R1p) of the half mirror 24. Therefore, if, for example, the latter ratio is 1:x (x≦1), the former ratio is assumingly 1:x−α (α≧0). When the ratio of (T1p ×R1s) to (T1s×R1p) is large, it is necessary to use such an optical element, as a polarizing plate, that has a large difference in the transmission factor with respect to a certain polarized light component and to another polarized light component in a direction perpendicular thereto. If, on the other hand, the ratio of (T1p×R1s) to (T1s×R1p) is relatively small, a method that uses a difference in the transmission factor between the respective polarized light components, to be caused by tilting a parallel flat plate, as in the present embodiment, is sufficient. Further, as for the element 130, such an element provided by a glass plate on which a dielectric material multilayered film having predetermined polarization characteristics is formed, may be used. On that occasion, the element may be disposed so that its surface extends perpendicularly to the optical axis AX.

Figure 4:
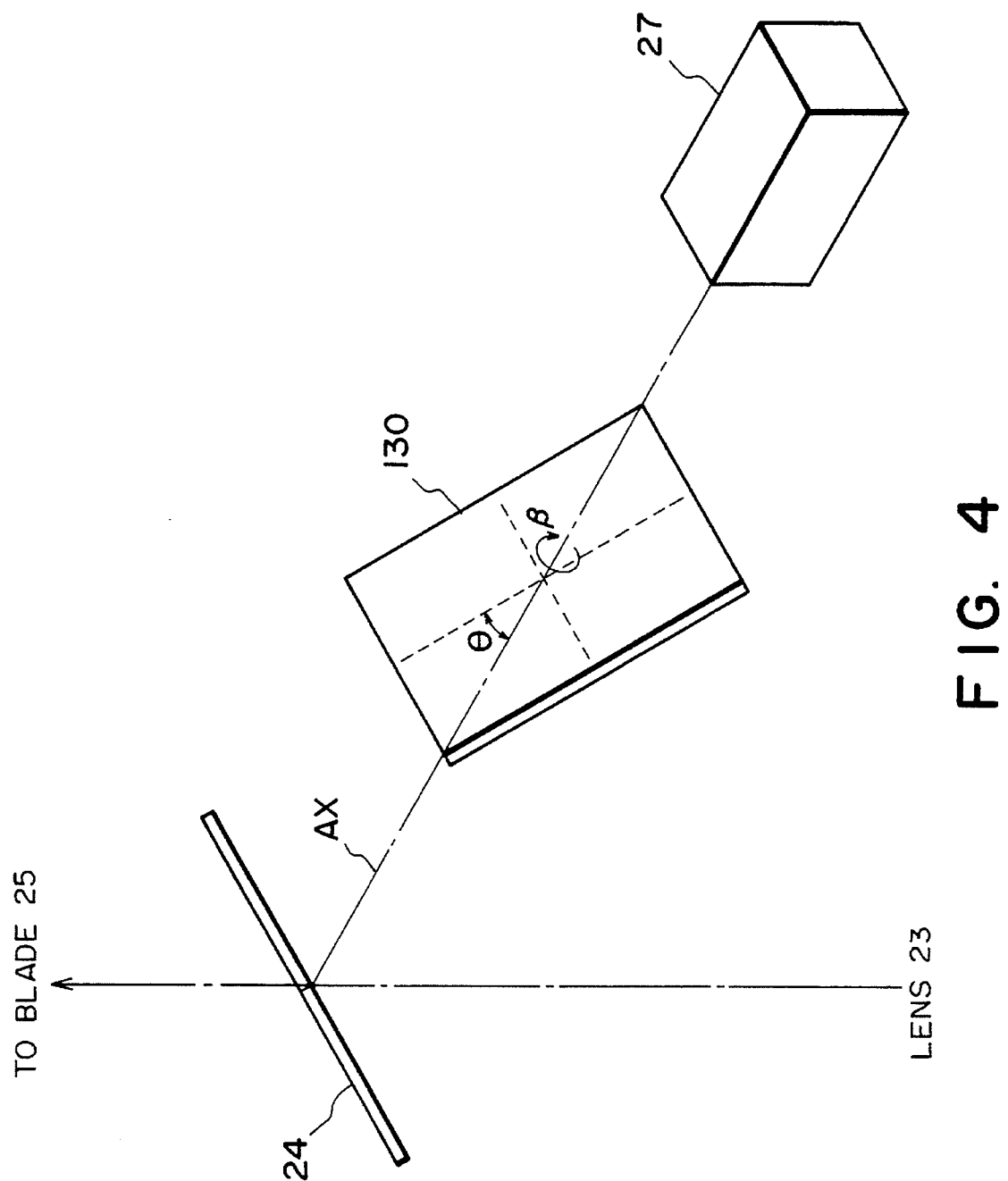
FIG. 4 is a perspective view, showing the state of setting of the correcting optical element.
Figure 5B:
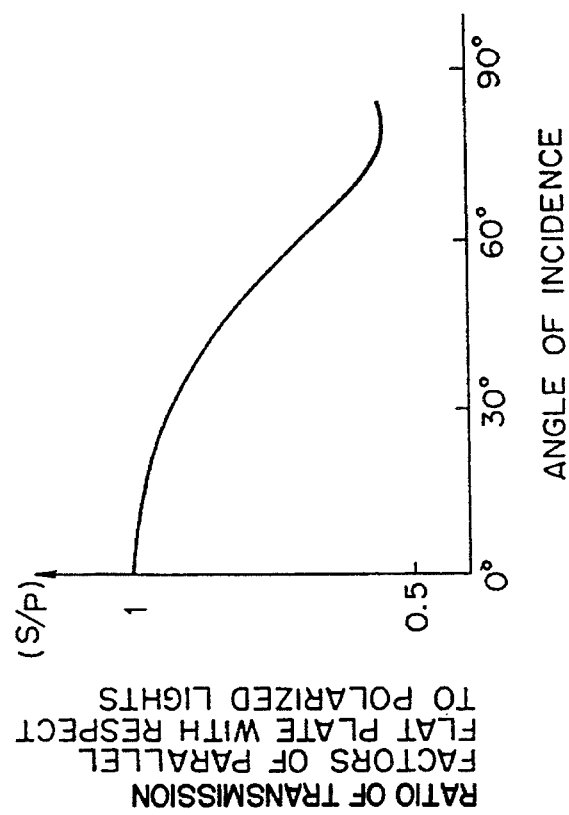
FIGS. 5A and 5B are graphs, respectively, each showing the polarization characteristic of the correcting optical element.
Figure 5A:
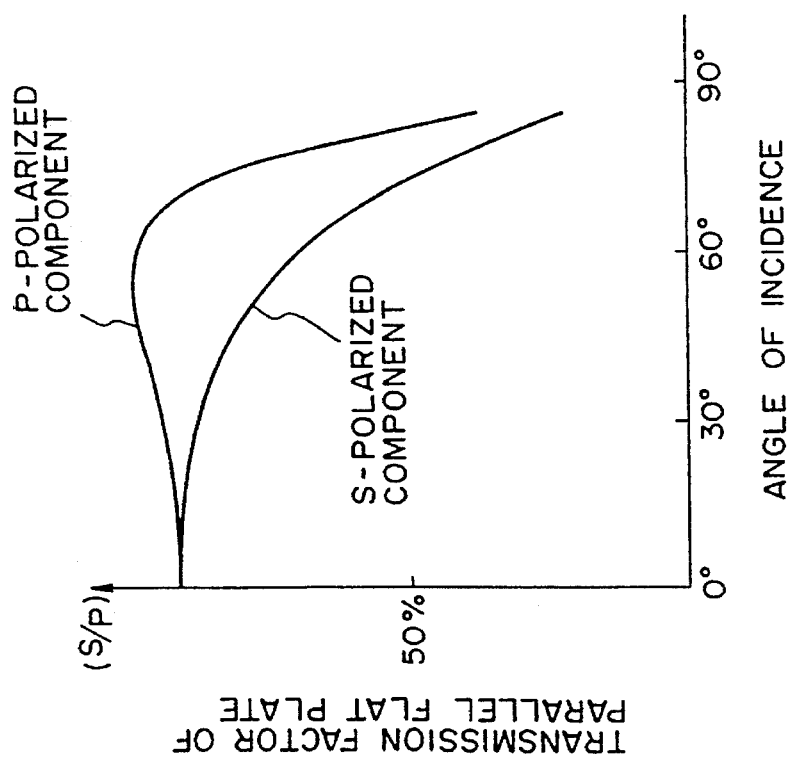

FIG. 4 is a perspective view showing a portion of the FIG. 2 arrangement. In FIG. 4, the set state of the correcting optical element 130 provided by a parallel flat plate is clearly seen. This optical element 130 is a glass plate made of quartz ($SiO_2$) and having a high transmission factor with respect to the laser light (λ=248.4 nm) to be inputted thereto. The angular (θ) dependency of the transmission factor of this optical element 130 is generally such as illustrated in FIG. 5A. Also, FIG. 5B shows the ratio (S/P) of transmission factors of the polarized light components, obtained on the basis of the characteristics shown in FIG. 5A. Adjustment may be made on the basis of these polarization characteristics of the optical element 130 so that, if the ratio of (T1p×R1s) to (T1s×R1p) of the half mirror 24 is small (e.g. 1:0.9), the optical element may be inclined with respect to the optical axis AX by an angle not less than θ=40 degrees while the rotational angle β may be adjusted by rotating the element about the optical axis AX to thereby set the optical element 130 to satisfy the conditions of equation (1).

In order to allow such an adjustment, the exposure apparatus of the present embodiment is provided with an adjusting mechanism 230 which is operable to adjust the inclination of the correcting optical element 130 in the θ direction, as shown in FIG. 2, and also to adjust the rotational angle of the correcting optical element 130 in the β direction.

Further, while in the present embodiment the correcting optical element 130 is disposed on the optical path between the half mirror 24 and the photoreceptor 27, it may be disposed on the optical path between the half mirror 24 and the masking blade 25. On that occasion, the correcting optical element may be set to satisfy the following condition:

$$T2p/T2s = (T1s \cdot R1p)/(T1p \cdot R1s) \quad (2)$$

Also, two, first and second correcting optical elements may be provided on both of these optical paths. On the other hand, although the photoreceptor 27 is provided to receive the laser light reflected by the half mirror 24, it may be provided to receive the laser light transmitted through the half mirror 24 with the laser light reflected by the half mirror 24 being directed to the masking blade 25. If, on this occasion, the correcting optical element is provided between the half mirror 24 and the photoreceptor, the optical element may be set to satisfy the condition of equation (2). If, on the other hand, the optical element is provided between the half mirror 24 and the blade 25, the optical element is set to satisfy the condition of equation (1).

Figure 6:
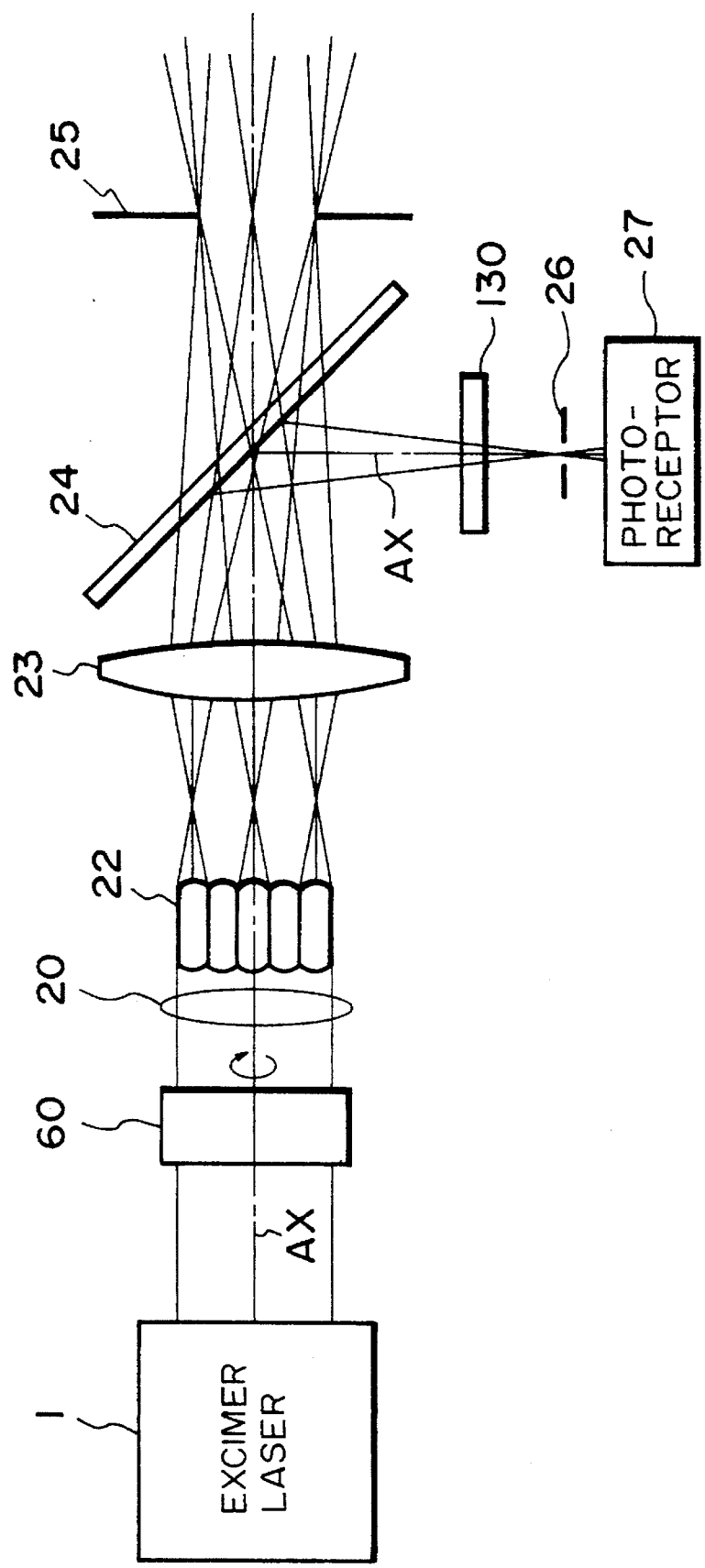
FIG. 6 is a fragmentary and schematic view showing a modified form of an illumination optical system usable in the exposure apparatus of the FIG. 1 embodiment.

FIG. 6 is a fragmentary and schematic view, showing a modified form of the illumination optical system of the exposure apparatus of the FIG. 1 embodiment. Like numerals are assigned to the elements corresponding to those shown in FIG. 2.

Denoted in FIG. 6 at 60 is an image rotator which is disposed rotatably about the optical axis AX as an axis of rotation. By means of a rotating mechanism, not shown, during exposure of a wafer, the image rotator 60 rotates to rotate the laser light 20 emanating therefrom, about the optical axis AX as an axis of rotation.

Since, in many cases, the laser light from the excimer laser 1 has a non-uniform and asymmetrical sectional intensity distribution, mere illumination of the reticle with the laser light from the laser 1 does not easily result in formation of a uniform luminance distribution on the secondary light source surface as defined by the optical integrator 22, in the FIG. 1 apparatus. Therefore, it is not so easy to transfer the circuit pattern of the reticle onto the wafer accurately.

Since, in the present embodiment, the image rotator 60 is used to rotate the laser light, the intensity distribution in the beam cross-section of the laser light can be made symmetrical and, therefore, the luminance distribution on the secondary light source surface can be made symmetric with respect to the optical axis. As a result, it is possible to improve the pattern transfer performance for the transfer of the circuit pattern of the reticle to the wafer. As the image rotator 60 rotates, the state of polarization of the laser light emanating therefrom changes with the rotation. In the present embodiment, however, a correcting optical element 130 is disposed on the optical path between a half mirror 24 and a photoreceptor 27. Therefore, regardless of the rotation of the image rotator 60, the illuminance upon the wafer surface can be monitored exactly by means of a photoreceptor 27, like the foregoing embodiment. Thus, it is always possible to execute the exposure amount control with good precision.

While in the foregoing embodiments the invention has been described with reference to a projection type exposure apparatus wherein a pattern of a reticle (mask) is projected through a projection optical system, the invention is not limited to this type of exposure apparatus. Thus, the present invention is also applicable to such an exposure apparatus wherein the exposure is effected in accordance with a contact exposure process, a proximity exposure process or a scan exposure process. Further, the present invention is also applicable to such an exposure apparatus wherein no laser is used as the exposure light source, or to an exposure apparatus wherein a light source that emits a different type of polarized light, other than a rectilinearly polarized light, is used.

In the embodiments described hereinbefore, a correcting means such that a parallel flat plate is disposed on at least one of the optical paths of the lights transmitted through and reflected by an amplitude-division type beam splitter, such as a half mirror, in order to assure that, independently of the state of polarization of an exposure light inputted to the beam splitter, the ratio of the P-polarized component and the S-polarized component of the light impinging on a wafer and the light impinging on a photoreceptor are substantially equal to each other. With this arrangement, the ratio of the illuminance on the wafer surface and the illuminance on the light receiving surface of the photoreceptor of the light receiving means can always be maintained constant and, as a result, the illuminance on the wafer surface can be monitored correctly even if the state of polarization of the exposure light changes. Accordingly, it is possible to provide an exposure apparatus in which correct exposure amount control can be made constantly.

Additionally, in order to make uniform or symmetric the intensity distribution in the cross-section of the light emanating from a laser such as an excimer laser to thereby improve the pattern transfer performance of the exposure apparatus, a movable optical element such as an image rotator can be effectively disposed on the path of the exposure light.

As compared therewith, if in conventional exposure apparatuses an image rotator is used to receive a laser light from a laser and if the image rotator is rotated, the reception of a portion of the laser light from the image rotator through a beam splitter such as a half mirror does not ensure correct exposure amount control, since the plane of polarization of the laser light emanating from the image rotator changes continuously. The present invention can be free from such a problem and, therefore, a movable optical element effective to reduce non-uniformness in illuminance due to a speckle pattern can be used and disposed as desired.

Figure 7:
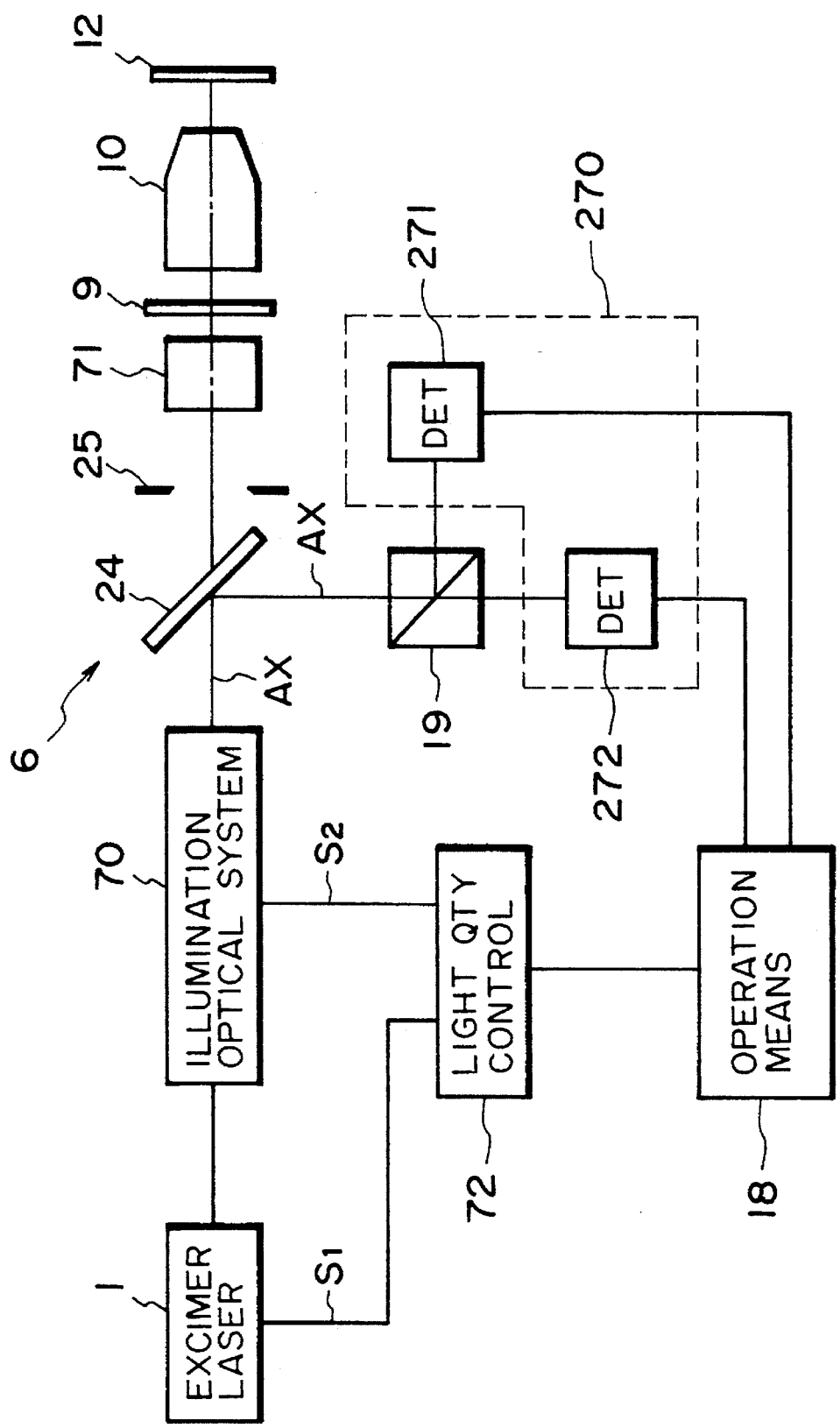
FIG. 7 is a schematic and diagrammatic view of an exposure apparatus according to another embodiment of the present invention.

FIG. 7 is a schematic view of an exposure apparatus according to a further embodiment of the present invention. Also, in this embodiment, the invention is applied to an exposure apparatus for the manufacture of semiconductor devices.

In FIG. 7, like numerals as those in FIGS. 1 and 2 are assigned to the elements corresponding to those shown in FIGS. 1 and 2. It is to be noted that in the present embodiment, the KrF excimer laser 1 used is of an injection locking type. Denoted in FIG. 7 at 70 is an optical system effective to illuminate an aperture of a masking blade 25 with uniform illuminance; at 71 is an imaging lens system effective to bring the aperture of the masking blade 25 and a circuit pattern area of a reticle 9 into, an optically conjugate relationship; at 72 is a light quantity control means; at 270 is a light detecting means; and at 271 and 272 are first and second detectors. Reference numeral 18 denotes an operation means (processing unit) for executing a predetermined operation or operations in response to a signal from the first detector and a signal from the second detector. Reference numeral 19 denotes an auxiliary amplitude-division type beam splitter, for dividing again the light reflected by a half mirror 24. This light dividing element 19 comprises a combination of a pair of rectangular prisms whose slanted surfaces are cemented to each other. Between these slanted surfaces, a multilayered film of a dielectric material is formed. The light quantity control means 72 operates to adjust the intensity of light emission of the laser 1, through a signal line S1, and also to adjust the opening/closure or the degree of opening of a shutter or a stop means provided in the optical system 70, through a signal line S2. With such adjustment, the laser light directed to the aperture of the masking blade 25, namely, the laser light directed to the reticle 9 can be intensity-modulated or ON/OFF controlled.

The optical system 70 receives the laser light from the laser 1, through a beam expander (not shown) and directs the beam-expanded laser light to the half mirror 24.

Like the foregoing embodiments, the half mirror 24 is disposed with inclination by an angle of 45 degrees with respect to the optical axis AX, and is adapted to amplitude-divide the laser light from the optical system 70 into a transmitted light and a reflected light. The transmitted light is directed to the masking blade, while the reflected light is directed to the light dividing element 19 having its light dividing surface inclined by an angle of 45 degrees with respect to the optical axis AX. The light dividing element 19 serves to amplitude-divide a received light into a reflected light and a transmitted light. The reflected light is directed to the detector 271, while the transmitted light is directed to the detector 272.

The operation means 18 is operable to detect the intensity of the laser light irradiating the aperture of the masking blade 25, on the basis of signals from the detectors 271 and 272. More particularly, it produces a signal proportional to the illuminance upon the plane in which the aperture is defined. This luminance is proportional to the illuminance upon the circuit pattern area of the reticle 9 and the illuminance upon a resist provided on the wafer 12. Therefore, based on the produced signal, the amount of exposure of the wafer 12 with the laser light can be controlled.

The reflection factor and the transmission factor of each of the half mirror 24 and the light dividing means 19 with respect to the P-polarized component and the S-polarized component, are measured beforehand, and they are used for the detection and signal formation by the operation means 18 as described above.

In the present embodiment, the aperture of the masking blade 25 is irradiated with the laser beam from the laser 1, through the optical system 70. At this time, by means of the half mirror 24 which is disposed on the path of the laser light, which has a light dividing surface of a size larger than the diameter of the laser light and whose transmission factor and reflection factor with respect to the P-polarized component and the S-polarized component are predetected, a portion of the laser light inputted to the half mirror is reflected to the light dividing means 19. The light received by the light dividing means 19 is amplitude-divided thereby into two lights, and the reflected light is detected by the detector 271 while the transmitted light is detected by the detector 272. These detectors 271 and 272 produce, on the basis of photoelectric conversion, those signals corresponding to the intensities of the respectively detected lights.

In accordance with the light intensities as detected by the first and second detectors 271 and 271, the operation means 18 calculates the intensity of the laser light inputted to the aperture of the masking blade 25. Then, on the basis of an output signal from the operation means 18 and by using the light quantity control means 72 to which the output signal of the operation means is applied, the quantity of light irradiation of the aperture by the laser light is controlled. Here, the light quantity control means 72 may operate to adjust the intensity of the laser light to be outputted from the laser 1 or, alternatively, to change the diameter of an aperture stop in the illumination system 70, so that the quantity of light irradiation to the aperture of the masking blade 25 becomes equal to a predetermined quantity.

Next, a method of detecting the intensity of the laser light directed to the aperture of the masking blade 25 will be explained by reference to FIG. 8.

Figure 8:
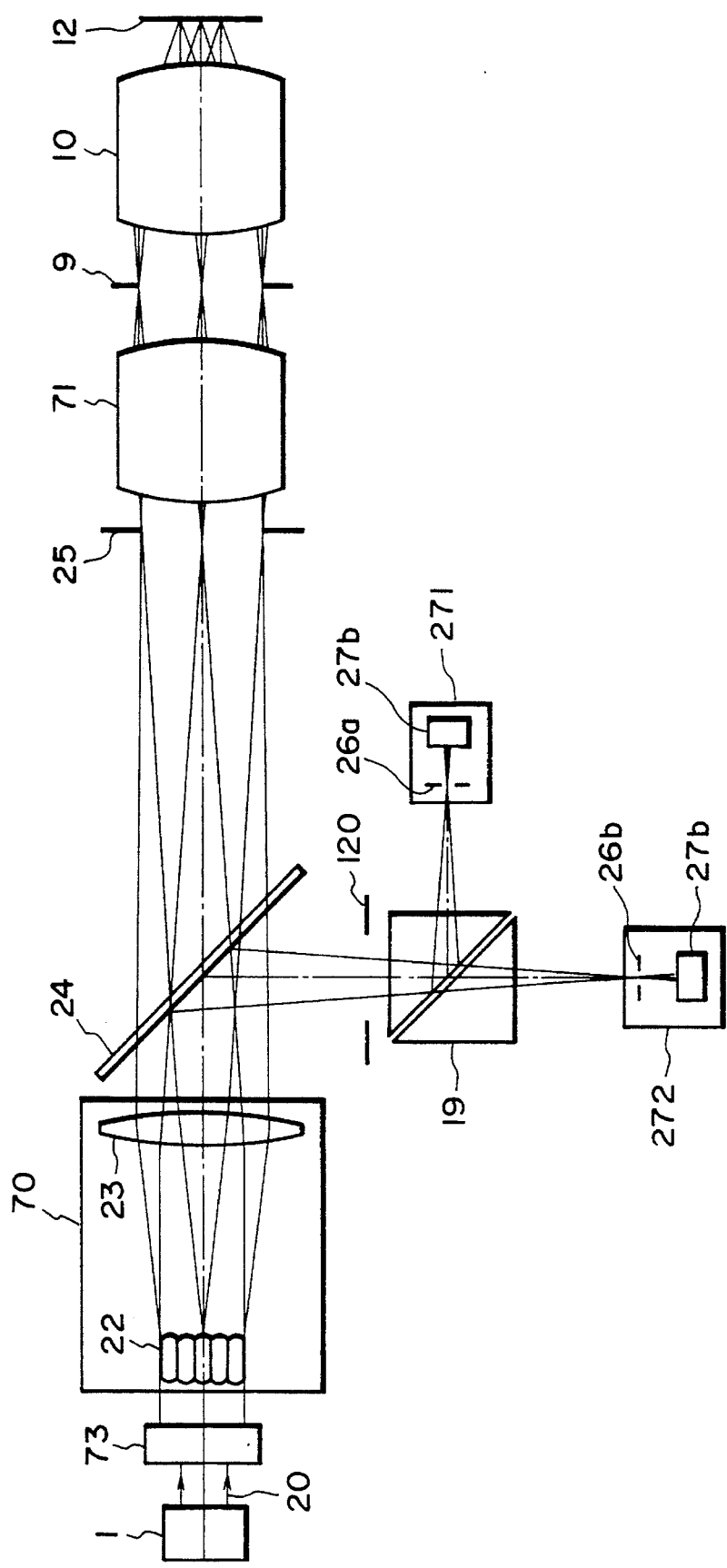
FIG. 8 is a fragmentary enlarged view showing a portion of the FIG. 7 apparatus.

FIG. 8 is a fragmentary enlarged view of a portion of the FIG. 7 apparatus. In FIG. 8, like numerals as of those used in FIGS. 7 and 2 are assigned to the elements corresponding to those in these Figures.

Denoted at 73 is the beam expander as described hereinbefore, which comprises a lens assembly consisting of a combination of plural lenses. Denoted at 26a, 26b and 120 each is a stop having a predetermined aperture. Denoted at 27a and 27b are photoreceptors.

In FIG. 8, light 20 from a laser 1 is received by the beam expander 73 by which the diameter thereof is expanded, such that the light is transformed by the beam expander into light of a predetermined beam diameter. Then, the diameter-expanded light is inputted to an optical integrator 22 (secondary light source forming means) for forming a plurality of secondary light sources. Light beams from respective secondary light sources which are defined at the light emission side of the integrator 22, are each concentrated by a condensing lens 23. Those portions of the light beams from the condensing lens 23, which are passed through the half mirror 24, are directed to illuminate the aperture of the masking blade 25 with uniform illuminance.

The light passing the aperture is directed through the imaging lens system 71 to illuminate the circuit pattern area of the reticle 9 with uniform illuminance. Here, the imaging lens system 71 serves to project an image of the aperture on the reticle 9. The light passed through the circuit pattern area of the reticle 9 is directed by the projection lens system 10 to the wafer 12, whereby an image of the circuit pattern is formed on the wafer. By this, the resist material on the wafer 12 is exposed to the circuit pattern image.

On the other hand, the light reflected by the half mirror 24 is amplitude-divided by means of the light dividing element 19 into two lights of a reflected light and a transmitted light. These lights are directed to the apertures of the stops 26a and 26b, respectively, each being disposed at a position optically conjugate with (equivalent to) the aperture of the masking blade 25.

As for the light dividing means 19, one whose reflection factor and transmission factor with respect to the P-polarized light and the S-polarized light are predetected, is used. Also, as regards this light dividing means 19, the one which shows different rates of light division, with respect to the S-polarized component and the P-polarized component, is used. The lights passed through the apertures of the stops 26a and 26b are detected and photoelectrically converted by the photoreceptors 27a and 27b, respectively. It is now assumed that the intensities of the S-polarized light and the P-polarized light, to be defined on the aperture of the masking blade 25 on an occasion when the half mirror 24 is not present, are denoted by So and Po.

When the reflection factor and the transmission factor of the half mirror 24 with respect to the S-polarized component are denoted by R1s and T1s, respectively; the reflection factor and the transmission factor of the half mirror 24 with respect to the P-polarized component are denoted by R1p and T1p, respectively; the reflection factor and the transmission factor of the light dividing means 19 with respect to the S-polarized component are denoted by R2s and T2s; the reflection factor and the transmission factor of the light dividing means 19 with respect to the P-polarized light component are denoted by R2p and T2p; the illuminances on the stops 26b and 26a which are at the positions optically conjugate with the aperture of the masking blade 25 are denoted by $I_1$ and $I_2$, respectively; and the illuminance at the aperture of the masking blade 25 is denoted by $I_0$, then the following relations are obtainable:

$$I_0 = T1s \times So + T1p \times Po \quad (3)$$

$$I_1 = R1s \times T2s \times So + R1p \times T2p \times Po \quad (4)$$

$$I_2 = R1s \times R2s \times So + R1p \times R2p \times Po \quad (5)$$

In the present embodiment, the light dividing element 19 is arranged to show polarization characteristics satisfying the following relation:

$$T2p/T2s \neq R2p/R2s$$

By solving these simultaneous equations (3), (4) and (5), the illuminance $I_0$ at the aperture of the masking blade 25 can be detected. Namely, even if the state of polarization of the laser light inputted to the half mirror 24 changes, the intensity of the laser light irradiating the aperture of the masking blade can always be detected correctly.

In the present embodiment, an equation or equations for calculation of the illuminance $I_0$, equivalent to solving the simultaneous equations (3), (4) and (5), have been programmed in the operation means 18, such that on the basis of signals from the photoreceptors 27a and 27b corresponding to the illuminances $I_1$ and $I_2$ and inputted to the operation means 18, the operation means 18 operates to produce a signal corresponding to the illuminance $I_0$. Then, the amount of exposure of the wafer 12 is controlled in accordance with the thus produced signal.

In the present embodiment, as described, the illuminances upon plural planes optically conjugate with a surface to be irradiated, are detected by using photoreceptors provided on these planes and, on the basis of the detected illuminances upon these planes, the operating means 18 performs a predetermined operation (calculation), to thereby assure that the illuminance on the surface being irradiated is detected with high precision, regardless of any change in the polarization characteristics of the irradiating light.

Figure 9:
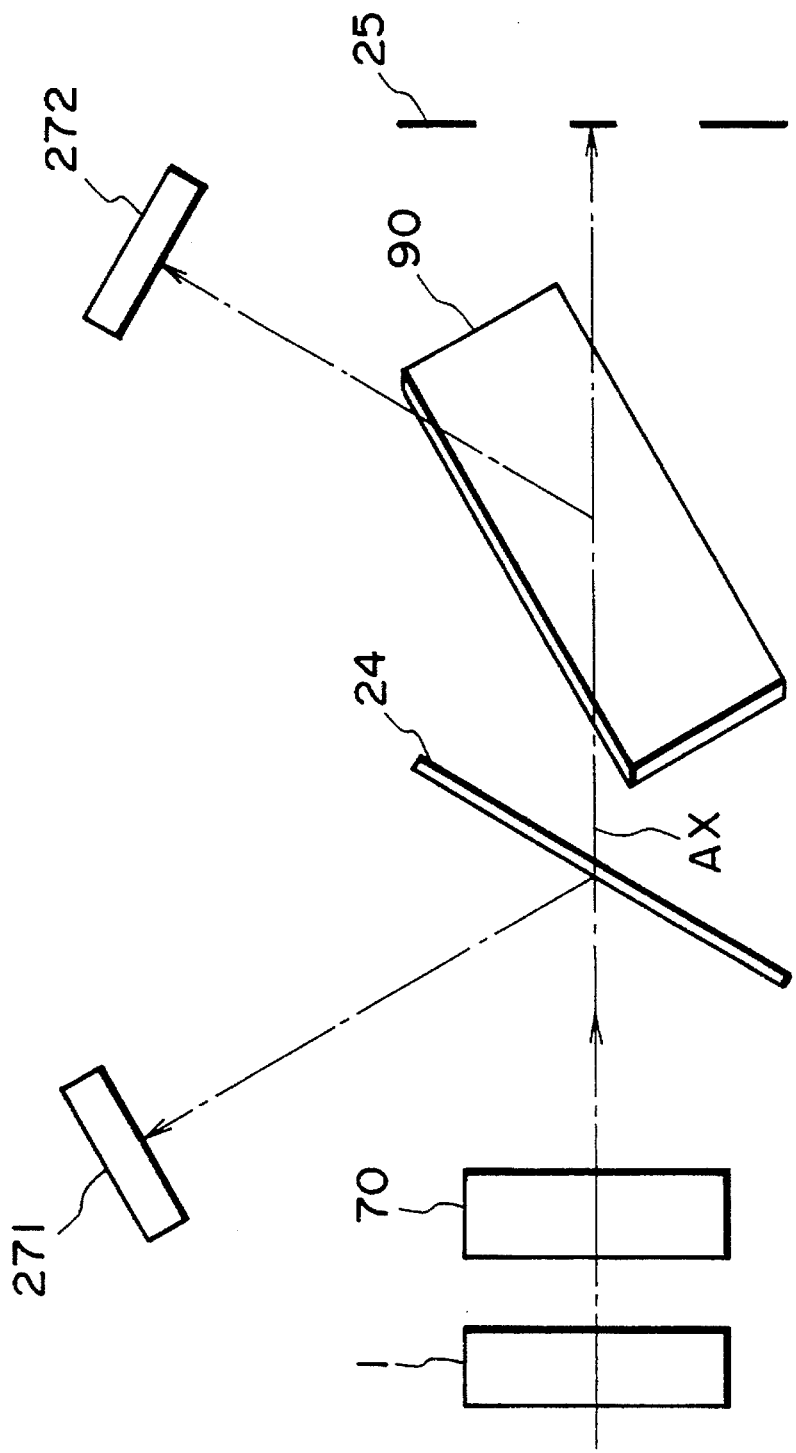
FIG. 9 is a schematic representation showing a modified form of the FIG. 7 apparatus.

FIG. 9 is a fragmentary and schematic view, showing a modified form of the FIG. 7 apparatus.

In this embodiment, a half mirror 24 and a light dividing means 90 whose transmission factors and reflection factors with respect to the S-polarized component and the P-polarized component are predetected, are disposed between the optical system 70 and the aperture of the masking blade 25. Laser light is amplitude-divided by the half mirror 24 and the light dividing element 90, and the resultant reflected lights are detected by first and second detectors 271 and 272, respectively. The laser light passed through both of the half mirror 24 and the light dividing element 90 is directed to the aperture of the masking blade 25. The light dividing means 90 comprises a transparent parallel flat plate, in this embodiment.

Like the FIG. 7 embodiment, in the present embodiment the output signals of the first and second detectors 271 and 272 are used to calculate the quantity of light irradiation to the aperture of the masking blade 25.

Figure 10:
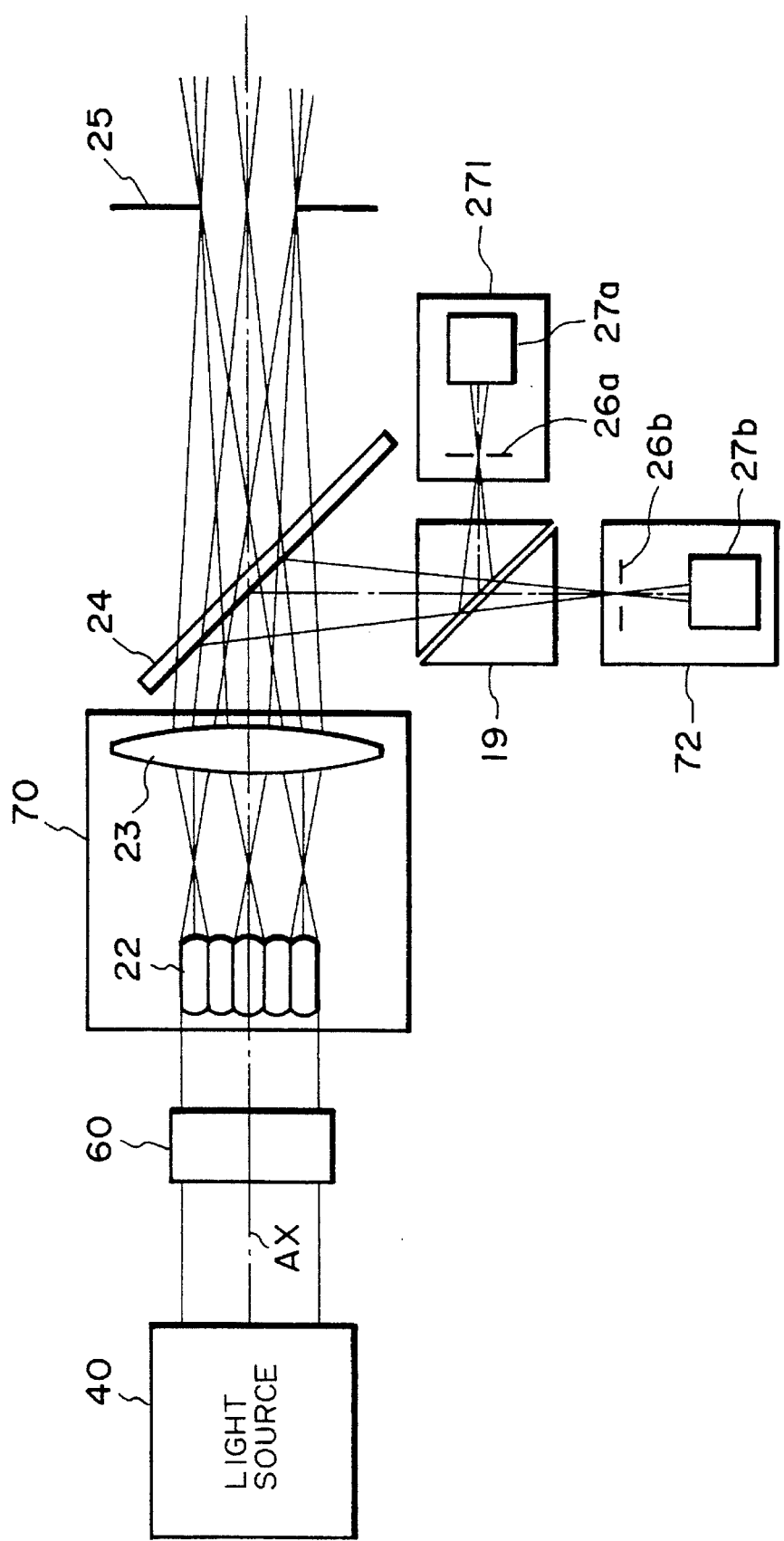
FIG. 10 is a schematic representation showing another modified form of the FIG. 7 apparatus.

FIG. 10 is a fragmentary and schematic view, showing another modified form of the FIG. 7 apparatus. In FIG. 10, like numerals as those used in FIG. 7 are assigned to corresponding elements.

In the present embodiment, a light source 40 comprises a pulse oscillation type excimer laser or a continuous oscillation type laser, for example, having an elliptical cross-sectional shape of its emitted beam. The present embodiment is arranged so that, on such an occasion, an image rotating element 60 such as an image rotator is disposed between the light source 40 and the optical system 70 (secondary light source forming means 22). The rotating element 60 is rotated during the exposure to assure that the cross-sectional intensity distribution of the laser light from the light source 40 is made symmetrical with respect to the optical axis AX. Namely, the element 60 of the present embodiment has the same function as that of the image rotator 60 described with reference to FIG. 6.

The remaining portion of the structure of the present embodiment is similar to that of the FIG. 7 embodiment.

In the embodiments described with reference to FIGS. 7–10, the invention is applied to a projection type exposure apparatus wherein a circuit pattern of a reticle is projected onto a wafer. However, the concept of the present invention described with reference to these embodiments is also applicable to other type of exposure apparatuses such as a proximity type one, a contact type one, a scan type one or otherwise.

Also, in the arrangement shown in FIG. 8 or FIG. 10, the light reflected by the half mirror 24 is directed to a detector. Inversely, however, the arrangement may be modified so that the light transmitted through the half mirror 24 is directed to a detector while the light reflected by the half mirror is directed to a reticle. Further, in the FIG. 7 arrangement, the light reflected by the half mirror 24 is directed to a detector. However, the arrangement may be modified so that the light transmitted through the half mirror 24 is directed to the detector while the light reflected by the half mirror 24 is directed to the light dividing means 90. On the other hand, the light dividing means 90 used to direct the reflected light to its detector, may be used to direct the light reflected thereby to the aperture of the masking blade and to direct the light transmitted therethrough to the detector.

Moreover, like the half mirror 24, each of the light dividing means 19 and 20 may be provided by a substrate of SiO$_2$ having a multilayered film of dielectric material formed thereon. Also, as another example of the light dividing means 19, a transparent parallel flat plate such as shown in FIG. 2 is usable.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

supplying means for supplying a radiation beam having a state of polarization changeable with time;

a detector; and an optical arrangement comprising (i) means for amplitude-dividing the radiation beam supplied from said supplying means to produce first and second beams, said optical arrangement directing the first beam to a workpiece to expose the workpiece with the first beam and directing the second beam to said detector to cause the detector to produce a signal representing the intensity of the second beam and (ii) means for adjusting at least one of the first and second beams so as to maintain constant an intensity ratio between the first and second beams independently of a change in the state of polarization of the radiation beam.

2. An apparatus according to claim 1, wherein said supplying means supplies a laser beam as the radiation beam.

3. An apparatus according to claim 2, wherein said supplying means comprise an excimer laser for producing the laser beam.

4. An apparatus according to claim 3, wherein said optical arrangement comprises means for illuminating a circuit pattern of an original with the first beam, and a projection optical system for directing the first beam from the circuit pattern illuminated by said illuminating means to the workpiece to form an image of the pattern on the workpiece.

5. An apparatus according to claim 4, wherein said supplying means comprises an image rotator for receiving the laser beam from said excimer laser and for rotating the received laser beam, an optical integrator for receiving the laser beam from said image rotator to form a plurality of secondary light sources, and a lens system for concentrating each beam from said secondary light sources and for directing a concentrated beam to said optical arrangement.

6. An apparatus according to claim 4, further comprising control means responsive to the signal produced by said detector to control the amount of exposure of the workpiece with the first beam.

7. An exposure apparatus, comprising:

supplying means for supplying a radiation beam having a state of polarization changeable with time;

a detector;

an optical arrangement for amplitude-dividing the radiation beam supplied from said supplying means to produce first and second beams, said optical arrangement directing the first beam to a workpiece to expose the workpiece with the first beam and directing the second beam to said detector to cause the detector to produce a signal representing the intensity of the second beam, wherein the signal from said detector changes in response to a change in the state of polarization of the radiation beam supplied from said supplying means; and responsive means being responsive to the signal produced by said detector to produce an intensity signal representing the intensity of the first beam, which intensity signal is substantially unchangeable with a change in the state of polarization of the radiation beam supplied from said supplying means.

8. An apparatus according to claim 7, wherein said supplying means supplies a laser beam as the radiation beam.

9. An apparatus according to claim 8, wherein said supplying means comprises an excimer laser for producing the laser beam.

10. An apparatus according to claim 9, wherein said optical arrangement comprises means for illuminating a circuit pattern of an original with the first beam, and a projection optical system for directing the first beam from the circuit pattern illuminated by said illuminating means to the workpiece to form an image of the pattern on the workpiece.

11. An apparatus according to claim 10, wherein said supplying means comprises an image rotator for receiving the laser beam from said excimer laser and for rotating the received laser beam, an optical integrator for receiving the laser beam from said image rotator to form a plurality of secondary light sources, and a lens system for concentrating each beam from said secondary light sources and for directing a concentrated beam to said optical arrangement.

12. An apparatus according to claim 10, further comprising control means responsive to the signal produced by said responsive means to control the amount of exposure of the workpiece with the first beam.

13. An exposure apparatus, comprising:

supplying means for supplying a radiation beam;

a detector; and an optical arrangement including a beam splitter and optical means;

wherein said beam splitter is operable to amplitude-divide the radiation beam from said supplying means to produce first and second beams, said beam splitter further being operable to direct the first beam to a workpiece to be exposed and to direct the second beam to said detector; and wherein said optical means is provided between said beam splitter and said detector, for receiving the second beam from said beam splitter and for directing the received second beam to said detector, wherein said optical means is effective to maintain the ratio of intensity between a P-polarized component and an S-polarized component of the second beam, inputted to said detector, to be substantially the same as the ratio of intensity between a P-polarized component and an S-polarized component of the first beam, independently of a change in the state of polarization of the radiation beam.

14. An apparatus according to claim 13, wherein said beam splitter includes a half mirror disposed with inclination with respect to an optical axis of said optical arrangement, wherein a portion of the radiation beam is transmitted through said half mirror by which the first beam is produced while another portion of the radiation beam is reflected by said half mirror whereby the second beam is produced, and wherein said optical means satisfies the following relation:

$$T2p/T2s=(T1p\cdot R1s)/(T1s\cdot R1p)$$

where $T2s$ and $T2p$ are the transmission factors of said optical means with respect to the S-polarized component and the P-polarized component of the second beam, respectively, $T1p$ and $T1s$ are the transmission factors of said beam splitter with respect to the P-polarized component and the S-polarized component of the radiation beam, respectively, and $R1p$ and $R1s$ are the reflection factors of said beam splitter with respect to the P-polarized component and the S-polarized component of the radiation beam, respectively.

15. An apparatus according to claim 14, wherein said optical means includes a parallel plate disposed with inclination with respect to an optical axis of said optical arrangement and being transparent with respect to the second beam.

16. An apparatus according to claim 14, wherein said optical means includes a polarizing plate.

17. An apparatus according to claim 15, further comprising an adjusting mechanism effective to change the angle of inclination of said parallel plate with respect to the optical axis and also to rotationally move said parallel plate about the optical axis.

18. An apparatus according to claim 14, wherein said supplying means supplies a laser beam as the radiation beam.

19. An apparatus according to claim 18, wherein said supplying means comprises an excimer laser for producing the laser beam.

20. An apparatus according to claim 19, wherein said optical arrangement includes means for illuminating a circuit pattern of an original with the first beam, and a projection optical system for directing the first beam from the circuit pattern illuminated by said illuminating means to the workpiece to form an image of the pattern on the workpiece.

21. An apparatus according to claim 20, wherein said supplying means includes an image rotator for receiving the laser beam from said excimer laser and for rotating the received laser beam, an optical integrator for receiving the laser beam from said image rotator to form a plurality of secondary light sources, and a lens system for concentrating each beam from said secondary light sources and for directing a concentrated beam to said optical arrangement.

22. An apparatus according to claim 21, further comprising responsive means being responsive to a signal outputted from said detector as a result of photoelectric conversion of the second beam by said detector, said responsive means being effective to control the amount of exposure of the workpiece with the first beam on the basis of the signal from said detector.

23. An apparatus according to claim 13, wherein said beam splitter includes a half mirror disposed with inclination with respect to an optical axis of said optical arrangement, wherein a portion of the radiation beam is reflected by said half mirror whereby the first beam is produced while another portion of the radiation beam is transmitted through said half mirror whereby the second beam is produced, and wherein said optical means satisfies the following relation:

$$T2p/T2s=(T1s\cdot R1p)/(T1p\cdot R1s)$$

where $T2s$ and $T2p$ are the transmission factors of said optical means with respect to the S-polarized component and the P-polarized component of the second beam, respectively, $T1p$ and $T1s$ are the transmission factors of said beam splitter with respect to the P-polarized component and the S-polarized component of the radiation beam, respectively, and $R1p$ and $R1s$ are the reflection factors of said beam splitter with respect to the P-polarized component and the S-polarized component of the radiation beam, respectively.

24. An apparatus according to claim 23, wherein said optical means includes one of a polarizing plate and a parallel plate disposed with inclination with respect to the optical axis of said optical arrangement and being transparent with respect to the second beam.

25. An exposure apparatus, comprising:

supplying means for supplying a radiation beam;

a first detector;

a second detector; and an optical arrangement including first and second beam splitters and responsive means;

wherein said first beam splitter is operable to amplitude-divide the radiation beam from said supplying means to produce first and second beams, said first beam splitter being effective to direct the first beam to a workpiece to be exposed;

wherein said second beam splitter is operable to amplitude-divide the second beam from said first beam splitter to produce third and fourth beams, said second beam splitter being effective to direct the third beam to said first detector so that a first signal is produced from said first detector, and also to direct the fourth beam to said second detector so that a second signal is produced from said second detector; and wherein said responsive means is responsive to the first and second signals from said first and second detectors, said responsive means being effective to produce a signal substantially proportional to the intensity of the first beam.

26. An apparatus according to claim 25, wherein said second beam splitter satisfies the following relation:

$$Tp/Ts \neq Rp/Rs$$

where Tp and Ts are the transmission factors with respect to the P-polarized component and the S-polarized component of the second beam and Rp and Rs are the reflection factors with respect to the P-polarized component and the S-polarized component of the second beam.

27. An apparatus according to claim 26, further comprising control means for controlling the amount of exposure of the workpiece with the first beam on the basis of a signal produced from said responsive means.

28. An apparatus according to claim 27, wherein said supplying means supplies a laser beam as the radiation beam.

29. An apparatus according to claim 28, wherein said supplying means comprises an excimer laser for producing the laser beam.

30. An apparatus according to claim 29, wherein said optical arrangement includes means for illuminating a circuit pattern of an original with the first beam, and a projection optical system for directing the first beam from the circuit pattern illuminated by said illuminating means to the workpiece to form an image of the pattern on the workpiece.

31. An apparatus according to claim 30, wherein said supplying means includes an image rotator for receiving the laser beam from said excimer laser and for rotating the received laser beam, an optical integrator for receiving the laser beam from said image rotator to form a plurality of secondary light sources, and a lens system for concentrating each beam from said secondary light sources and for directing a concentrated beam to said optical arrangement.

32. An apparatus according to claim 31, wherein said first beam splitter includes a half mirror disposed with inclination with respect to an optical axis of said optical arrangement and wherein a portion of the radiation beam is transmitted through said half mirror whereby the first beam is produced while another portion of the radiation beam is reflected by said half mirror whereby the second beam is produced.

33. An apparatus according to claim 31, wherein said first beam splitter includes a half mirror disposed with inclination with respect to an optical axis of said optical arrangement and wherein a portion of the radiation beam is reflected by said half mirror whereby the first beam is produced while another portion of the radiation beam is transmitted through said half mirror whereby the second beam is produced.

34. An exposure apparatus, comprising:

supplying means for supplying a radiation beam;

a first detector;

a second detector; and an optical arrangement including a first beam splitter, a second beam splitter and responsive means;

wherein said first beam splitter is operable to amplitude-divide the radiation beam from said supplying means to produce first and second beams, said first beam splitter being effective to direct the first beam to said first detector so that a first signal is outputted from said first detector;

wherein said second beam splitter is operable to amplitude-divide the second beam from said first beam splitter to produce third and fourth beams, said second beam splitter being effective to direct the third beam to said second detector so that a second signal is outputted from said second detector and also to direct the fourth beam to a workpiece to be exposed; and wherein said responsive means being responsive to the first and second signals from said first and second detectors, and said responsive means being effective to produce a signal substantially proportional to the intensity of the fourth beam.

35. An apparatus according to claim 34, further comprising control means for controlling the amount of exposure of the workpiece with the fourth beam on the basis of a signal produced from said responsive means.

36. An apparatus according to claim 35, wherein said supplying means supplies a laser beam as the radiation beam.

37. An apparatus according to claim 36, wherein said supplying means comprises an excimer laser for producing the laser beam.

38. An apparatus according to claim 37, wherein said optical arrangement comprises means for illuminating a circuit pattern of an original with the fourth beam, and a projection optical system for directing the fourth beam from the circuit pattern illuminated by said illuminating means to the workpiece to form an image of the pattern on the workpiece.

39. An apparatus according to claim 38, wherein said supplying means includes an image rotator for receiving the laser beam from said excimer laser and for rotating the received laser beam, an optical integrator for receiving the laser beam from said image rotator to form a plurality of secondary light sources, and a lens system for concentrating each beam from said secondary light sources and for directing a concentrated beam to said optical arrangement.

40. An apparatus according to claim 39, wherein each of said first and second beam splitters is disposed with inclination with respect to an optical axis of said optical arrangement.

41. An exposure apparatus, comprising:

supplying means for supplying a radiation beam;

a detector; and an optical arrangement including a beam splitter and optical means;

wherein said beam splitter is operable to amplitude-divide the radiation beam from said supplying means to produce first and second beams, said beam splitter being effective to direct the first beam to said detector; and wherein said optical means receives the second beam and directs the received second beam to a workpiece to the exposed, said optical means being effective to maintain the ratio of intensity between a P-polarized component and an S-polarized component of the second beam inputted to the workpiece to be substantially the same as the ratio of intensity of a P-polarized component and an S-polarized component of the first beam, independently of a change in the state of polarization of the radiation beam.

42. An apparatus according to claim 41, wherein said beam splitter includes a half mirror disposed with inclination with respect to an optical axis of said optical arrangement, wherein a portion of the radiation beam is transmitted through said half mirror whereby the first beam is produced while another portion of the radiation beam is reflected by said half mirror whereby the second beam is produced, and wherein said optical means satisfies the following relation:

$$T2p/T2s=(T1p \cdot R1s)/(T1s \cdot R1p)$$

where $T2s$ and $T2p$ are the transmission factors of said optical means with respect to the S-polarized component and the P-polarized component of the second beam, respectively, $T1p$ and $T1s$ are the transmission factors of said beam splitter with respect to the P-polarized component and the S-polarized component of the radiation beam, respectively, and $R1p$ and $R1s$ are the reflection factors of said beam splitter with respect to the P-polarized component and the S-polarized component of the radiation beam, respectively.

43. An apparatus according to claim 41, wherein said beam splitter includes a half mirror disposed with inclination with respect to an optical axis of said optical arrangement, wherein a portion of the radiation beam is reflected by said half mirror whereby the first beam is produced while another portion of the radiation beam is transmitted through said half mirror whereby the second beam is produced, and wherein said optical means satisfies the following relation:

$$T2p/T2s=(T1s \cdot R1p)/(T1p \cdot R1s)$$

where $T2s$ and $T2p$ are the transmission factors of said optical means with respect to the S-polarized component and the P-polarized component of the second beam, respectively, $T1p$ and $T1s$ are the transmission factors of said beam splitter with respect to the P-polarized component and the S-polarized component of the radiation beam, respectively, and $R1p$ and $R1s$ are the reflection factors of said beam splitter with respect to the P-polarized component and the S-polarized component of the radiation beam, respectively.

44. A method of manufacturing semiconductor devices, wherein a radiation beam having a plane of polarization changeable with time is divided by a half mirror into first and second beams, said method comprising the steps of:

exposing a semiconductor wafer with the first beam to print a circuit pattern on the wafer; and detecting intensity of the second beam during said exposing step to control the exposure, wherein the intensity of the second beam is detected while substantially compensating for a change in a ratio of intensity between the first and second beams resulting from a change in the plane of polarization of the radiation beam.

45. A method according to claim 44, further comprising disposing a second half mirror, for the compensation, on at least one of the paths of the first and second beams to attenuate the intensity of at least one corresponding beam, of the first and second beams, such that irrespective of a change in the plane of polarization, a ratio of intensity between a P-polarization component and an S-polarization component of the second beam is maintained substantially equal to that of the first beam.

46. A method of manufacturing semiconductor devices, wherein a radiation beam having a plane of polarization changeable with time is divided by a half mirror into first and second beams, said method comprising the steps of:

exposing a semiconductor wafer with the first beam to print a circuit pattern on the wafer;

disposing a second half mirror on a path of the second beam to divide the second beam into third and fourth beams;

detecting intensity of each of the third and fourth beams during said exposing step to control the exposure of the wafer; and producing a signal which is substantially proportional to the intensity of the first beam on the basis of the detected intensities of the third and fourth beams.

47. A method of manufacturing semiconductor devices, wherein a radiation beam having a plane of polarization changeable with time is divided by a half mirror into first and second beams, said method comprising the steps of:

disposing a second half mirror on a path of the second beam to divide the second beam into third and fourth beams;

exposing a semiconductor wafer with the fourth beam to print a circuit pattern on the wafer;

detecting the intensity of each of the first and third beams during said exposing step to control the exposure of the wafer; and producing a signal which is substantially proportional to the intensity of the fourth beam on the basis of the detected intensities of the first and third beams.

48. An exposure apparatus, comprising:

producing means for producing a laser beam having a plane of polarization changeable with time; and an optical arrangement, comprising a half mirror and a photodetector, for receiving the laser beam produced by said producing means, said half mirror dividing the received laser beam into first and second beams and directing the second beam to said photodetector, said optical arrangement being arranged to substantially compensate for a change in a ratio of intensity between the first and second beams resulting from a change in the plane of polarization of the laser beam.

49. An apparatus according to claim 48, wherein said producing means comprises an image rotator for rotating the laser beam about a center of the laser beam.

50. An apparatus according to claim 48, wherein, for the compensation, said optical arrangement further comprises a second half mirror disposed on at least one of the paths of the first and second beams so as to attenuate the intensity of at least one corresponding beam, of the first and second beams, such that irrespective of a change in the plane of polarization of the laser beam, a ratio of intensity between a P-polarization component and an S-polarization component of the second beam is maintained substantially equal to that of the first beam.

51. An exposure apparatus, comprising:

producing means for producing a laser beam having a plane of polarization changeable with time;

an optical arrangement, comprising first and second half mirrors and first and second photodetectors, for receiving the laser beam produced by said producing means, said first half mirror dividing the received laser beam into first and second beams and directing the first beam to a substrate, while directing the second beam to said second half mirror, said second half mirror dividing the received second beam into third and fourth beams and directing the third and fourth beams to said first and second photodetectors, respectively, said first and second photodetectors respectively producing first and second signals respectively representing intensities of the third and fourth beams; and signal processing means for receiving the first and second signals produced by said first and second photodetectors, respectively, said signal processing means processing the first and second signals to produce a third signal substantially proportional to intensity of the first beam.

52. An apparatus according to claim 51, wherein said producing means comprises an image rotator for rotating the laser beam about a center of the laser beam.

53. An exposure apparatus, comprising:

producing means for producing a laser beam having a plane of polarization changeable with time; and an optical arrangement, comprising first and second half mirrors and first and second photodetectors, for receiving the laser beam produced by said producing means, said first half mirror dividing the received laser beam into first and second beams and directing the first beam to said second half mirror while directing the second beam to said first photodetector, said second half mirror dividing the received first beam into third and fourth beams and directing the third beam to a substrate to be exposed and the fourth beam to said second photodetector, said first and second photodetectors respectively producing first and second signals respectively representing intensities of the second and fourth beams; and signal processing means for receiving the first and second signals produced by said first and second photodetectors, respectively, said signal processing means processing the first and second signals to produce a third signal substantially proportional to intensity of the third beam.

54. An apparatus according to claim 53, wherein said producing means comprises an image rotator for rotating the laser beam about a center of the laser beam.

55. A method of monitoring the intensity of a radiation beam having a state of polarization changeable with time, said method comprising the steps of:

splitting a radiation beam into first and second beams by using a half mirror disposed in a path of the radiation beam, detecting the intensity of the first beam; and during said detecting step, substantially compensating for a change in an intensity ratio of the first and second beams, the change in intensity ratio being caused by a change in the state of polarization of the radiation beam.

56. A method according to claim 55, further comprising disposing, for said compensation, a correcting plate in a path of the first radiation beam after the half mirror, and maintaining the intensity ratio between a P-polarized component and an S-polarized component of the first beam and the intensity ratio between a P-polarized component and an S-polarized component of the second beam substantially equal to each other independently of a change in the state of polarization of the radiation beam.

57. A method of monitoring the intensity of a radiation beam having a state of polarization changeable with time, by splitting the radiation beam into first and second beams through a half mirror disposed in a path of the radiation beam, the intensity of the first beam being changeable with a change in the state of polarization of the radiation beam, said method comprising the steps of:

dividing the first beam into a partial beam, which comprises third and fourth beams, by using another half mirror;

converting the third and fourth beams into third and fourth signals, respectively, each representing the intensity of the corresponding third and fourth beams; and processing the produced third and fourth signals to produce a signal, representing the intensity of the second beam, which is unchangeable with a change in the state of polarization of the radiation beam.

* * * * *

UNITED STATES PATENT AND TRADEMARK OFFICE
CERTIFICATE OF CORRECTION

PATENT NO. : 5,475,491
DATED : December 12, 1995
INVENTOR(S) : TAKAHISA SHIOZAWA It is certified that error appears in the above-indentified patent and that said Letters Patent is hereby corrected as shown below:

COLUMN 4:

Line 12, "to" should be deleted; and

Line 32, "principle" (first occurrence) should read --principal--.

COLUMN 8:

Line 44, "two," should be deleted.

COLUMN 10:

Line 21, "into." should read --into--.

COLUMN 11:

Line 24, "271," should read --272,--.

COLUMN 14:

Line 35, "comprise" should read --comprises--.

UNITED STATES PATENT AND TRADEMARK OFFICE
CERTIFICATE OF CORRECTION

PATENT NO. : 5,475,491
DATED : December 12, 1995
INVENTOR(S) : TAKAHISA SHIOZAWA It is certified that error appears in the above-indentified patent and that said Letters Patent is hereby corrected as shown below:

COLUMN 19:

Line 10, "the" (second occurrence) should read --be--.

Signed and Sealed this

Twenty-first Day of May, 1996

*Attest:*

BRUCE LEHMAN

*Attesting Officer*  *Commissioner of Patents and Trademarks*